United States Patent [19]

Chao et al.

[11] Patent Number: 4,736,165

[45] Date of Patent: Apr. 5, 1988

[54] DISTORTION GENERATING CIRCUIT

[75] Inventors: James Chao, Westlake Village; Thomas M. Straus, Los Angeles, both of Calif.

[73] Assignee: Hughes Aircraft Company, Los Angeles, Calif.

[21] Appl. No.: 39,877

[22] Filed: Apr. 17, 1987

[51] Int. Cl.$^4$ .............................................. H03F 1/32
[52] U.S. Cl. .................................. 330/149; 328/162; 333/26
[58] Field of Search .................... 330/149; 328/15, 16, 328/20, 23, 162; 333/25, 26, 218; 455/50, 327, 330, 295

[56] References Cited

U.S. PATENT DOCUMENTS

| | | | |
|---|---|---|---|
| 3,732,502 | 5/1973 | Seidel | 330/149 |
| 3,825,843 | 7/1974 | Felsberg et al. | 328/163 |
| 4,157,508 | 6/1979 | Hecken | 328/142 |
| 4,186,352 | 1/1980 | Hallford | 455/327 |
| 4,399,562 | 8/1983 | Hallford | 455/327 |
| 4,513,250 | 4/1985 | Harman | 328/163 |

OTHER PUBLICATIONS

Nojima and Okamoto, "Predistortion Nonlinear Compensator for Microwave SSB-AM System", IEEE 1980, pp. 33.2.1–33.2.6.

Hecken and Heidt, "Predistortion Linearization of the AR 6A Transmitter", IEEE 1980, pp. 33.1.1–33.3.6.

*Primary Examiner*—James B. Mullins
*Attorney, Agent, or Firm*—Terje Gudmestad; A. W. Karambelas

[57] ABSTRACT

Microwave circuitry is disclosed for a distortion generating circuit. Input and output baluns are disposed on the tap surface of a substrate while secondary and primary conductors are respectively juxtaposed under these baluns. Four diodes connected in a star configuration are coupled between the primary and secondary conductors. The carrier signal may be fed into the input balun which is coupled to the secondary conductors and across the diode star configuration, generating intermodulation signals while suppressing the carrier signals. The intermodulation signal is coupled from the primary conductors to the output balun where it may be fed to a microwave amplifier to cancel intermodulation by-products thereof. A DC signal may be impressed across the diode star configuration to adjust the amplitude of the intermodulation signal generated by the diodes.

9 Claims, 2 Drawing Sheets

DISTORTION GENERATING CIRCUIT

BACKGROUND OF THE INVENTION

1. Field of the Invention

The present invention relates in general to distortion compensating circuits and more particularly to third order distortion generating circuits used to compensate for nonlinearities in microwave amplifiers.

2. Description of Related Art

Microwave amplifier transmitters in amplifying a carrier signal produce undesirable third order intermodulation distortion signals as by-products. Predistortion circuits have been developed to generate intermodulation signals which are used to cancel the intermodulation by-products generated within the microwave amplifiers. More specifically, intermodulation signals generated in the predistortion circuit are 180° out-of-phase and of equal amplitude with the intermodulation products of the microwave amplifier so that when the two signals are combined the intermodulation signals will cancel each other. Therefore, the carrier signal will be transmitted with little or no distortion.

Examples of such predistortion circuits are given in U.S. Pat. Nos. 4,157,508, 4,513,250, 3,732,502 and 3,825,843. In Hecken, U.S. Pat. No. 4,157,508, a signal cuber is described which comprises a resistive bridge characterized in that a pair of oppositely-poled diodes are connected in parallel with a resistor in each branch of one pair of opposite branches. In Harmon, U.S. Pat. No. 4,513,250, a signal cuber is disclosed for producing third order harmonics which include a split ring mixer consisting of two transformers and four diodes connected in a bridge type arrangment. In U.S. Pat. No. 3,732,502, the distortion generator comprises two RC coupled transistors which generate higher order signals. Lastly, in U.S. Pat. No. 3,825,843, a squarer and multiplier are used to generate third order intermodulations. None of these predistortion circuits, however, are suitable for microwave frequencies.

SUMMARY OF THE INVENTION

It is therefore an object of this invention to provide a distortion generating circuit which operates at frequencies higher than those in the prior art.

It is a further object of the present invention to provide a predistortion generating circuit which suppresses the carrier signal.

It is still a further object of the present invention to provide a distortion generating circuit in which the amplitude of the intermodulation products may be controlled.

It is still a further object of the invention to provide a distortion generating circuit which operates at microwave frequencies.

In accordance with the foregoing objects, a distortion generating circuit according to the present invention includes a dielectric substrate having a first and a second surface. An input balun located on the first surface of the substrate converts an unbalanced microwave signal to a balanced microwave signal. Juxtaposed under the input balun are a plurality of secondary conductors, each about a quarter of a wavelength long. Four diodes connected in a star configuration on the second surface of the substrate are coupled between the secondary conductors.

A carrier signal fed into the input balun is coupled through the substrate to the secondary conductors and is impressed across the four diodes which, being nonlinear devices, generate third order intermodulation signals based on the carrier signal frequency. A DC signal is coupled to the common point of the four diode star configuration for adjusting the amplitude of the third order intermodulation signals. A plurality of primary conductors each about a quarter wavelength long are coupled to the four diodes, and an output balun located on the first surface of the substrate is juxtaposed over these primary conductors.

The third order intermodulation signals generated by the diodes are coupled from the primary conductors through the substrate to the output balun. The third order intermodulation signals thereafter can be subjected to additional processing and ultimately fed into a microwave amplifier to cancel intermodulation signals generated by the amplifier.

Since the distortion generating circuit described above operates at microwave frequencies, an advantage of this invention is that it will operate over a broader frequency band than distortion generating circuits in the prior art.

Additional objects, advantages and characteristic features of the present invention will become readily apparent from the following detailed description of the preferred embodiment of the invention when considered in conjunction with the accompanying drawings.

DETAILED DESCRIPTION

Figure 1:
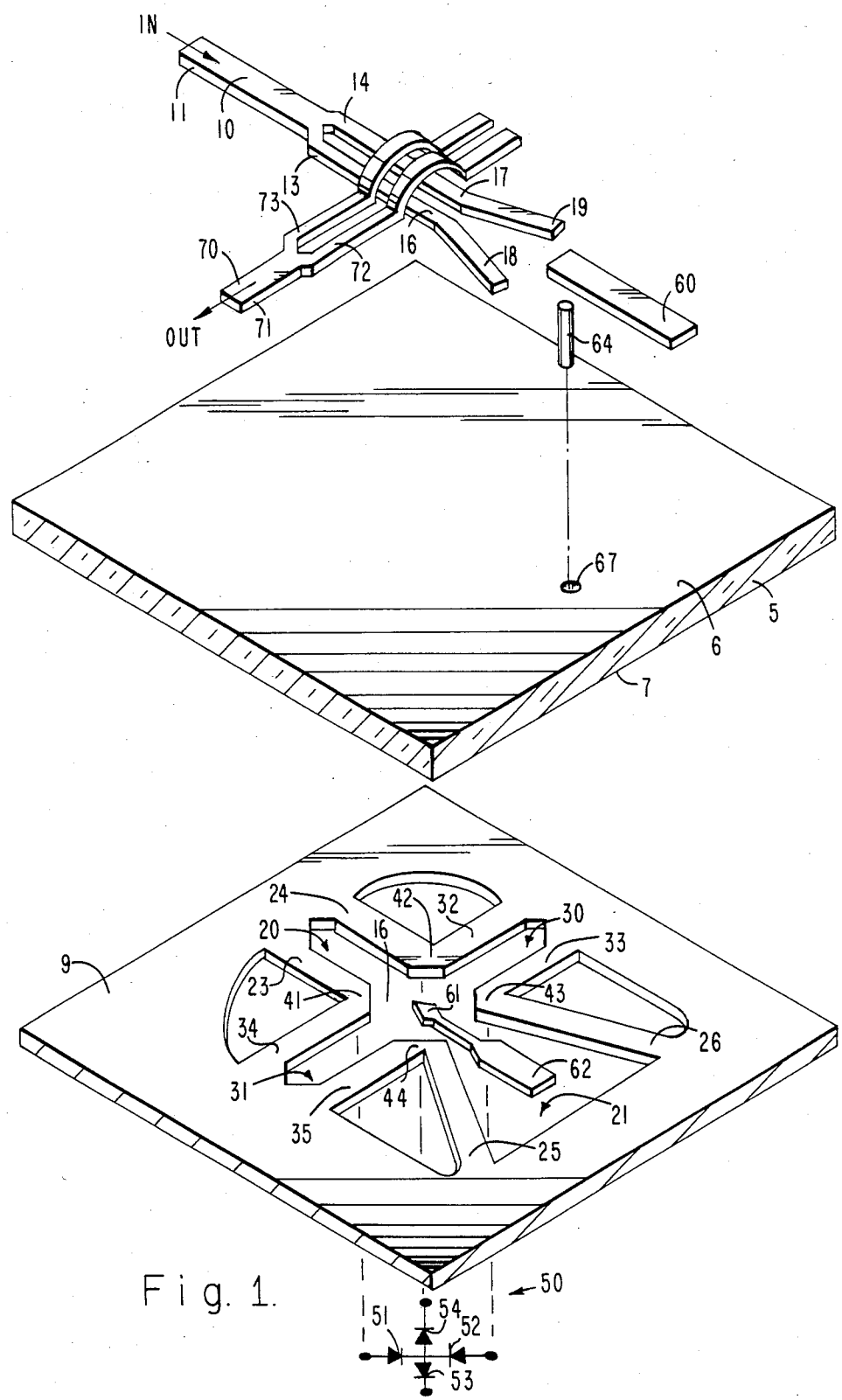
FIG. 1 is an exploded isometric view of a distortion generating circuit constructed in accordance with the invention.
Figure 3:
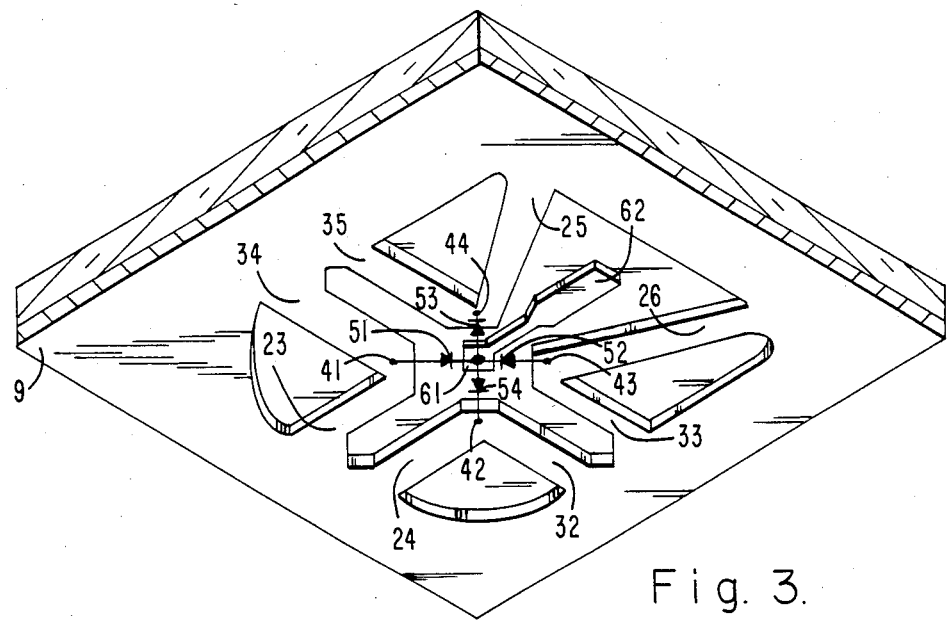
FIG. 3 is an isometric view of the bottom side of the circuit of FIGS. 1 and 2.
Figure 2:
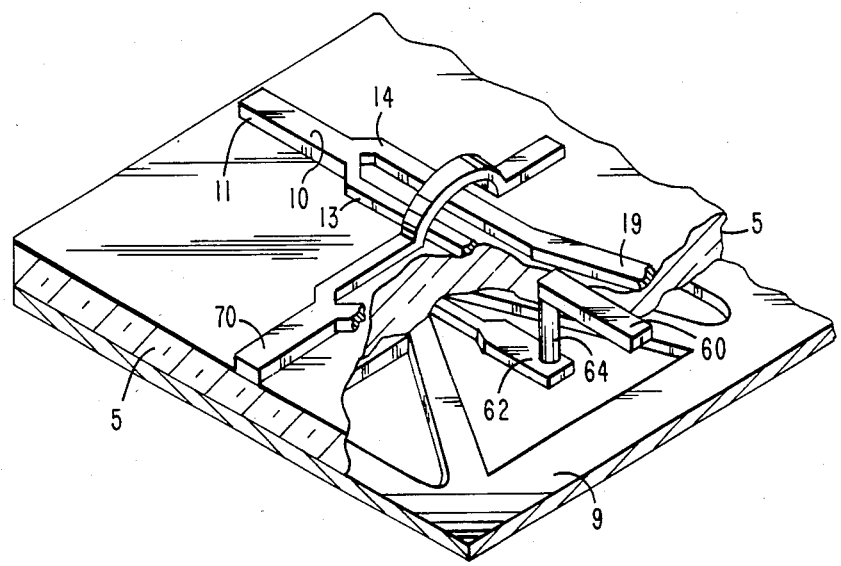
FIG. 2 is a partly broken away assembly view of the circuit of FIG. 1.

Referring now with greater particularity to FIGS. 1, 2 and 3, there is shown a microwave distortion generating circuit structure according to the principles of the invention which includes a planar dielectric substrate 5 having top and bottom essentially parallel surfaces 6 and 7. The dielectric substrate 5 has a ground region 9 on the bottom surface 7. The substrate 5 may be made of a material having a low dielectric constant, for example in the range of 2 to 4. The substrate may be any standard microwave substrate such as 95% teflon, and 5% fiberglass, for example.

An input balun 10 is disposed on the top surface 6 of substrate 5. The input balun 10 has an unbalanced conductor 11 which splits into two legs forming first and second balanced primary conductors 13 and 14. Balanced conductors 13 and 14 extend from input conductor 11 in a spaced parallel relationship forming leg portions 16 and 17, and extend into leg portions 18 and 19 therefrom which diverge from one another in a V-shaped relationship.

Two pairs of secondary conductors 20 and 21 are juxtaposed below the primary conductors 13 and 14. Secondary conductor pair 20 has two balanced secondary conductors, namely first and second secondary conductors 23 and 24, and secondary conductor pair 21 has two balanced secondary conductors, namely, third and fourth secondary conductors 25 and 26. Secondary conductors 23, 24, 25 and 26 are about a quarter of a wavelength long based on the operating frequency band of the circuit. Secondary conductors 23 and 25, and also secondary conductors 24 and 26 extend from ground region 9 toward each other to a separation gap 16. Secondary conductors 23 and 24 are in a spaced parallel relationship and juxtaposed under parallel leg portions 16 and 17, respectively, of primary balanced conductors 13 and 14. Secondary conductors 25 and 26 are in a V-shaped spaced relationship and juxtaposed under leg portions 18 and 19, respectively, of primary conductors 13 and 14. Secondary conductors 25 and 26 are in a V-shaped spaced relationship to provide space therebetween for a bias conductor 62, described below. Secondary conductors 23 and 25, and secondary conductors 24 and 26 interact with first and second primary conductors 13 and 14, respectively, to field couple RF energy between the top surface 6 and the bottom surface 7 of substrate 5.

Two pairs of primary conductors 30 and 31 are disposed on the bottom surface 7 of substrate 5. Primary conductor pairs 30 and 31 each have two balanced primary conductors, namely third and fourth primary conductors 32 and 33, and fifth and sixth primary conductors 34 and 35, respectively. Primary conductors 32, 33, 34 and 35 are about one quarter wavelength long based on the operating frequency band of the circuit. Primary conductors 32 and 33 of conductor pair 30, and primary conductors 34 and 35 of conductor pair 31 extend in a spaced parallel relationship from ground region 9 toward each other to the separation gap 16. Conductor pairs 20 and 21 are shown as arranged essentially orthogonally to conductor pairs 30 and 31, but may be arranged in any pattern which does not induce cross coupling between conductors. Primary conductors 32, 33, 34 and 35 form junctions 42, 43, 41 and 44 with secondary conductors 24, 26, 23 and 25, respectively, at gap 16.

An input biasing conductor 60 is located on the top surface 6 of the substrate 5, and typically is a rectangularly shaped metal strip. A further bias conductor 62 is located on the bottom surface 7 of substrate 5. Bias conductor 62 is typically made of an elongated flat metal strip. Bias conductor 60 and 62 are electrically connected to one another through a hole 67 in substrate 5 by a conductor 64. Conductor 64 may be a piece of copper wire, for example. Conductors 60, 62 and 64 may be soldered or welded together or integrally formed. Bias conductor 62 is disposed between secondary conductors 25 and 26 and extends into the central region of gap 16, such that tab 61 at the inner end of conductor 62 is approximately centered between junctions 41, 42, 43 and 44.

A diode configuration 50 is located on the bottom surface of substrate 5 isolated from the input balun 10 and an output balun 70. The diode configuration 50 is coplanarly interconnected between secondary conductors 24, 26, 23 and 25 and primary conductors 32, 33, 34 and 35 at junctions 42, 43, 41 and 44, respectively. Four diodes 51, 52, 53 and 54 (shown schematically) are on the bottom surface 7 of substrate 5. The diodes may be Schottky barrier beam lead diodes, for example. As shown in FIG. 3, the anodes of diodes 53 and 54 and cathodes of diodes 51 and 52 are directly connected to tab 61 of bias conductor 62. The anodes of diodes 51 and 52 are directly connected to junctions 41 and 43, respectively, and the cathodes of diodes 53 and 54 are directly connected to junctions 42 and 44, respectively.

The output balun 70 is located on the top surface 6 of substrate 5. Output balun 70 includes an unbalanced conductor 71 which splits into two balanced conductor legs which form fifth and sixth output balanced secondary conductors 72 and 73. Output balun 70 is typically arranged orthogonally to input balun 11, but may be at any other angle which does not induce cross coupling. Legs 72 and 73 cross over legs 13 and 14 without contacting the legs 13 and 14. Balanced secondary conductors 72 and 73 extend from output conductor 71 in a spaced parallel relationship. Output balun balanced conductor 72 is juxtaposed above fourth and sixth primary conductors 33 and 35. Furthermore, balanced conductor 73 is juxtaposed above third and fifth primary conductors 32 and 34. Primary conductors 33 and 35 interact with output balanced secondary conductor 72, and primary conductors 32 and 34 interact with output balanced secondary conductor 73 to field couple RF energy from the bottom of substrate 5 to the top.

In the preferred embodiment all conductors and ground planes are made of electrically conductive material such as copper. For a typical 13 GHz intermodulation generating circuit, conductors 13, 14, 72 and 73 may be about 10 mils in width, for example, and conductors 11 and 71 may be 20 mils wide. The width of conductors 23, 24, 25, 26, 32, 33, 34 and 35 may be 10 mils. The length of quarter wavelength conductors of conductor pairs 20, 30 and 31 are typically about 55 mils. The length of the conductor of conductor pair 21 are typically 60 mils. Substrate 5 may have a dielectric constant of 2.2 and may be 10 mils thick, for example.

In operation, an unbalanced RF microwave carrier signal is fed into the input balun 10 at conductor 11. The input signal is split into two balanced signals by primary conductors 13 and 14. The RF signal at primary conductors 13 and 14 is field coupled through substrate 5 to secondary conductors 23 and 25, and secondary conductors 24 and 26, respectively. About a quarter of the input RF microwave energy appears at each secondary conductor 23, 24, 25 and 26. Since secondary conductors 23, 24, 25 and 26 are each about a quarter wavelength long, junction points 42, 41, 43 and 44 are at an open circuit point, consequently, a high voltage point. The RF microwave energy at junction points 41, 42, 43 and 44 is impressed across diodes 51, 54, 52 and 53. Operating in their non-linear range, the diodes generate third order intermodulation signals. The symmetry of the four diode configuration 50 causes the fundamental RF microwave carrier signal to cancel.

A desirable feature of this invention is that a DC voltage applied to biasing conductor 60 appears at junction point 61 and across the four diodes. This DC voltage may be adjusted to reduce the symmetrical relationship between diodes 51, 52, 53 and 54 and thereby vary the amplitude of the third order intermodulation signal generated by the diodes. The third order intermodulation signals generated by the diodes are field coupled from primary conductors 32 and 34, and 33 and 35 through substrate 5 to the balanced conductors 73 and 72, respectively. The two balanced third order intermodulation signals at conductors 72 and 73 are combined into an unbalanced signal which appears at unbalanced conductor 71 of output balun 70. This third order intermodulation signal may be fed into a microwave amplifier to cancel the intermodulation by-products generated by the microwave amplifier.

Before applying the third order intermodulation signal into a microwave amplifier, this signal may be adjusted in phase and amplitude by employing a gain adjust stage, such as a FET amplifier and a phase adjust stage such as a varactor diode at the output of the distortion generating circuit of FIGS. 1-3. Likewise, a gain adjust stage can be employed at the input of the circuit to adjust the carrier signal before it enters the circuit.

Although the present invention has been shown and described with reference to a particular embodiment, nevertheless, various changes and modifications which are obvious to a person skilled in the art to which the invention pertains are deemed to lie within the spirit, scope, and contemplation of the invention.

What is claimed is:

1. A distortion generating circuit for generating third order intermodulation signals based on an RF microwave carrier signal which comprises:
    a dielectric substrate having first and second surfaces;
    an input balun located on said first surface of said dielectric substrate;
    an output balun located on said first surface of said dielectric substrate;
    four diodes located on said second surface of said substrate, each of said diodes having one end connected to a common point in a star configuration;
    four secondary conductors, each about one quarter wavelength long based on the frequency of said RF carrier signal, juxtaposed under said input balun on said second surface of said substrate, respective ones of said four secondary conductors being connected to respective non-common ends of said four diodes for coupling the RF microwave carrier signal from said input balun to respectives ones of said four diodes such that said RF carrier signal is impressed across said four diodes to generate third order intermodulation signals;
    four primary conductors, each about one quarter wavelength long based on the frequency of said RF carrier signal, located on said second surface and juxtaposed under said output balun, respective ones of said primary conductors being coupled to respective non-common ends of said four diodes such that the third order intermodulation signals generated by said four diodes are coupled to said output balun; and
    means for applying a DC voltage bias to the common point of said diode star configuration to control the amplitude of said third order intermodulation signals.

2. A distortion generating circuit as defined in claim 1 wherein:
    said input balun has an unbalanced conductor and two balanced conductors, said four secondary conductors being juxtaposed under the balanced conductors of said input balun; and
    said output balun has an unbalanced conductor and two balanced conductors arranged substantially orthogonally to the conductors of said input balun, said primary conductors being juxtaposed under the balanced conductors of said output balun.

3. A distortion generating circuit as defined in claim 2 wherein:
    said four secondary conductors include first, second, third and fourth secondary conductors, said first and third secondary conductors being juxtaposed under one of the balanced conductors of said input balun, said second and fourth secondary conductors being juxtaposed under the other balanced conductor of said input balun; and said four primary conductors include first, second, third and fourth primary conductors, said first and third primary conductors being juxtaposed under one of the balanced conductors of said output balun, and said second and fourth primary conductors being juxtaposed under the other balanced conductor of said output balun.

4. A distortion generating circuit for generating third order intermodulation signals based on a microwave RF carrier signal, comprising:
    a dielectric substrate having first and second surfaces;
    input balun means located on the first surface of said substrate for converting an unbalanced microwave signal into two balanced microwave signals;
    four diodes located on the second surface of said substrate and connected to each other at a common point, two of said diodes being connected cathode-to-cathode and the other two of said diodes being connected anode-to-anode;
    secondary conductor means located on the second surface of said substrate and connected to the non-common terminals of said four diodes, said secondary conductor means interacting with said input balun means for coupling microwave signals across said four diodes to generate third order intermodulation signals;
    output balun means located on the first surface of said substrate for converting two balanced microwave signals into an unbalanced signal;
    primary conductor means located on the second surface of said substrate and connected to the non-common terminals of said four diodes, said primary conductor means interacting with said output balun means for coupling third order intermodulation signals generated by said four diodes to said output balun means; and
    means for applying a DC voltage to said common point of said four diodes to vary the amplitude of said third order intermodulation signals.

5. The distortion generating circuit as defined in claim 4 wherein:
    said input balun means comprises an unbalanced conductor and two balanced conductors; and
    said output balun means comprises an unbalanced conductor and two balanced conductors arranged substantially orthogonally to the conductors of said input balun means.

6. The distortion generating circuit as defined in claim 4 wherein:
    said secondary conductor means includes four secondary conductors and said primary conductor means includes four primary conductors, respective ones of said four primary conductors being coupled to respective ones of said four secondary conductors such that four junctions are formed, and respective non-common terminals of said four diodes being connected to respective ones of said four junctions.

7. A distortion generating circuit comprising:
    a dielectric substrate having first and second surfaces;
    an input balun located on the first surface of said substrate and having first and second balanced conductors;
    first, second, third and fourth secondary conductors each about one quarter wavelength long based on an operating frequency of said circuit, located on the second surface of said substrate, said first and second secondary conductors being juxtaposed under said first balanced conductor and said third and fourth secondary conductors being juxtaposed under said second balanced conductor;

first, second, third and fourth primary conductors, each about one quarter wavelength long based on said operating frequency, located on the second surface of said substrate;

first, second, third and fourth diodes located on the second surface of said substrate, each of said diodes having one end connected to a common point, two of said diodes being coupled anode-to-anode and the other two of said diodes being coupled cathode-to-cathode, respective ones of the non-common ends of said first, second, third and fourth diodes being coupled to respective ones of said first, second, third and fourth secondary conductors and to respective ones of said first, second, third and fourth primary conductors;

an output balun located on the first surface of said substrate and having first and second output balanced conductors, said first output balanced conductor being juxtaposed over said first and second primary conductors and said second balanced output conductor being juxtaposed over said third and fourth primary conductors; and means for applying a DC voltage to said common point for biasing said diodes.

8. A distortion generating circuit as defined in claim 7 wherein said output balun is arranged substantially orthogonally to and crosses over said input balun.

9. A distortion generating circuit as defined in claim 7 wherein the cathode of each of said first and second diodes and the anode of each of said third and fourth diodes are connected together, the anode of said first diode is connected to said first secondary conductor and said first primary conductor, the anode of said second diode is connected to said fourth secondary conductor and fourth primary conductor, the cathode of said third diode is connected to said second secondary conductor and said second primary conductor, and the cathode of said fourth diode is connected to said third secondary conductor and said third primary conductor.

* * * * *